United States Patent
Higashiwaki et al.

(10) Patent No.: US 11,563,092 B2
(45) Date of Patent: Jan. 24, 2023

(54) GA2O3-BASED SEMICONDUCTOR DEVICE

(71) Applicants: NATIONAL INSTITUTE OF INFORMATION AND COMMUNICATIONS TECHNOLOGY, Tokyo (JP); TAMURA CORPORATION, Tokyo (JP); NOVEL CRYSTAL TECHNOLOGY, INC., Saitama (JP)

(72) Inventors: Masataka Higashiwaki, Tokyo (JP); Yoshiaki Nakata, Tokyo (JP); Takafumi Kamimura, Tokyo (JP); Man Hoi Wong, Tokyo (JP); Kohei Sasaki, Saitama (JP); Daiki Wakimoto, Saitama (JP)

(73) Assignees: National Institute of Information and Communications Technology, Tokyo (JP); Tamura Corporation, Tokyo (JP); Novel Crystal Technology, Inc, Saitama (JP)

(*) Notice: Subject to any disclaimer, the term of this patent is extended or adjusted under 35 U.S.C. 154(b) by 0 days.

(21) Appl. No.: 16/608,556

(22) PCT Filed: Apr. 26, 2018

(86) PCT No.: PCT/JP2018/017007
§ 371 (c)(1),
(2) Date: Oct. 25, 2019

(87) PCT Pub. No.: WO2018/199241
PCT Pub. Date: Nov. 1, 2018

(65) Prior Publication Data
US 2020/0144377 A1 May 7, 2020

(30) Foreign Application Priority Data
Apr. 27, 2017 (JP) .............................. JP2017-088866

(51) Int. Cl.
*H01L 29/10* (2006.01)
*H01L 29/24* (2006.01)
(Continued)

(52) U.S. Cl.
CPC .......... *H01L 29/24* (2013.01); *H01L 29/0619* (2013.01); *H01L 29/78* (2013.01);
(Continued)

(58) Field of Classification Search
CPC ..... H01L 29/0619; H01L 29/24; H01L 29/78; H01L 29/7827; H01L 29/812; H01L 29/872
See application file for complete search history.

(56) References Cited

U.S. PATENT DOCUMENTS

| | | | |
|---|---|---|---|
| 6,756,320 B2 * | 6/2004 | Passlack | C30B 23/02 438/763 |
| 7,982,239 B2 * | 7/2011 | McNutt | H01L 29/8122 257/471 |

(Continued)

FOREIGN PATENT DOCUMENTS

| | | |
|---|---|---|
| CN | 103782392 A | 5/2014 |
| CN | 106575608 A | 4/2017 |

(Continued)

OTHER PUBLICATIONS

Wong et al., "Current Aperture Vertical β-Ga2O3 MOSFETs Fabricated by N- and Si-Ion Implantation Doping," IEEE Electron Device Letters 40 (2019) pp. 431-434.*

(Continued)

*Primary Examiner* — Jay C Kim
(74) *Attorney, Agent, or Firm* — Scully, Scott, Murphy & Presser, PC

(57) ABSTRACT

A $Ga_2O_3$-based semiconductor device includes a $Ga_2O_3$-based crystal layer including a donor, and an N-doped region formed in at least a part of the $Ga_2O_3$-based crystal layer.

2 Claims, 17 Drawing Sheets

(51) Int. Cl.
  *H01L 29/06* (2006.01)
  *H01L 29/78* (2006.01)
  *H01L 29/812* (2006.01)
  *H01L 29/872* (2006.01)

(52) U.S. Cl.
  CPC ........ *H01L 29/7827* (2013.01); *H01L 29/812* (2013.01); *H01L 29/872* (2013.01)

(56) References Cited

U.S. PATENT DOCUMENTS

| | | | |
|---|---|---|---|
| 8,937,338 B2* | 1/2015 | Chowdhury | H01L 29/2003 257/194 |
| 9,142,623 B2* | 9/2015 | Sasaki | C30B 29/22 |
| 9,437,689 B2 | 9/2016 | Sasaki et al. | |
| 9,461,124 B2* | 10/2016 | Sasaki | H01L 21/02483 |
| 9,472,688 B2* | 10/2016 | Aketa | H01L 29/36 |
| 9,478,673 B2* | 10/2016 | Aketa | H01L 29/66143 |
| 9,590,050 B2* | 3/2017 | Hitora | H01L 21/0262 |
| 10,128,349 B2* | 11/2018 | Oda | H01L 29/43 |
| 10,147,813 B2* | 12/2018 | Huang | H01L 29/7391 |
| 10,153,356 B2* | 12/2018 | Oka | H01L 29/1095 |
| 10,230,007 B2* | 3/2019 | Sasaki | H01L 21/02565 |
| 10,249,767 B2 | 4/2019 | Sasaki et al. | |
| 10,256,323 B2* | 4/2019 | Tanaka | H01L 21/0254 |
| 10,256,352 B2* | 4/2019 | Sun | H01L 29/66666 |
| 10,312,361 B2* | 6/2019 | Chowdhury | H01L 29/0649 |
| 10,319,844 B2* | 6/2019 | Kitagawa | H01L 21/743 |
| 10,358,742 B2* | 7/2019 | Sasaki | H01L 21/02565 |
| 10,361,297 B2* | 7/2019 | Kiyosawa | H01L 29/1045 |
| 10,439,028 B2* | 10/2019 | Hitora | H01L 29/7722 |
| 10,538,862 B2* | 1/2020 | Goto | C30B 29/16 |
| 10,600,874 B2* | 3/2020 | Takizawa | H01L 21/02414 |
| 10,636,663 B2* | 4/2020 | Fujii | H01L 21/02631 |
| 10,804,362 B2* | 10/2020 | Tokuda | H01L 21/02628 |
| 10,833,166 B2* | 11/2020 | Yamamoto | H01L 29/78 |
| 2014/0217405 A1 | 8/2014 | Sasaki et al. | |
| 2014/0217469 A1 | 8/2014 | Sasaki et al. | |
| 2014/0217470 A1* | 8/2014 | Sasaki | H01L 29/7869 257/192 |
| 2015/0349124 A1* | 12/2015 | Lu | H01L 21/283 257/43 |
| 2016/0042949 A1 | 2/2016 | Sasaki et al. | |
| 2016/0141372 A1* | 5/2016 | Sasaki | H01L 29/78 257/43 |
| 2016/0265137 A1* | 9/2016 | Goto | H01L 21/0259 |
| 2016/0284853 A1* | 9/2016 | Pham | H01L 27/1225 |
| 2016/0300953 A1 | 10/2016 | Sasaki et al. | |
| 2016/0365418 A1 | 12/2016 | Sasaki et al. | |
| 2017/0213918 A1 | 7/2017 | Sasaki et al. | |
| 2017/0271460 A1* | 9/2017 | Chang | H01L 29/66462 |
| 2017/0278933 A1 | 9/2017 | Sasaki et al. | |
| 2018/0350967 A1 | 12/2018 | Sasaki et al. | |

FOREIGN PATENT DOCUMENTS

| | | | | |
|---|---|---|---|---|
| JP | 2010-141037 A | | 6/2010 | |
| JP | WO 2013/035845 | * | 3/2013 | ............. H01L 29/12 |
| JP | 2016-039194 A | | 3/2016 | |
| JP | 2016-197737 A | | 11/2016 | |
| JP | 2017-041593 A | | 2/2017 | |
| TW | 201511278 A | | 3/2015 | |
| WO | 2013/035843 A1 | | 3/2013 | |
| WO | 2013/035845 A1 | | 3/2013 | |
| WO | 2016/031633 A1 | | 3/2016 | |

OTHER PUBLICATIONS

Phys.org, "Development of world's first vertical gallium oxide transistor through ion implantation doping" (2018).*
Wong et al., "First Demonstration of Vertical Ga2O3 MOSFET: Planar Structure with a Current Aperture," IEEE (2017).*
Wong et al., "All-ion-implanted planar-gate current aperture vertical Ga2O3 MOSFETs with Mg-doped blocking layer," Applied Physics Express 11 (2018) 064102.*
Zhang et al., "First-principles study on electronic structure and optical properties of N-doped P-type β-Ga2O3," Science China 55 (2012) pp. 19-24.*
Zhang et al., "A comparison of electronic structure and optical properties between N-doped β-Ga2O3 and N—Zn co-doped β-Ga2O3," Physica B 407 (2012) pp. 1227-1231.*
Zhang et al., "Structural and optical properties of N-doped β-Ga2O3 films deposited by RF magnetron sputtering," Physica B 406 (2011) pp. 3079-3082.*
English translation of International Preliminary Report on Patentability dated Nov. 7, 2019, together with the Written Opinion received in related International Application No. PCT/JP2018/017007.
International Search Report dated Jul. 17, 2018 issued in PCT/JP2018/017007.
Liying, Zhang et al., "First-principles study on electronic structure and optical properties of N-doped P-type Beta-Ga2O3", Science China, Physics, Mechanics & Astronomy (Jan. 2012), vol. 55, No. 1 19-24.
Wong, Man Hoi et al., "Anomalous Fe diffusion in Si-ion-implanted Beta-Ga2O3 and its suppression in Ga2O3 transistor structures through highly resistive buffer layers", Applied Physics Letters 106, 032105 (2015).
Extended European Search Report dated Nov. 25, 2020 from related EP 18790539.3.
Notice of Reasons for Refusal dated Jun. 1, 2021 received from the Japanese Patent Office in related application 2017-088866 together with English language translation.
Office Action dated Mar. 31, 2022 received from the European Patent Office in related application EP 18 790 539.3.
Oda, Masaya et al: "Vertical Schottky barrier diodes of a-Ga2O3 fabricated by mist epitaxy", 2015 73rd Annual Device Research Conference (DRC), IEEE, Jun. 21, 2015, pp. 137-138, XP033188802, DOI: 10.1109/DRC.2015.7175593 ISBN: 978-1-4673-8134-5.
Higashiwaki, Masataka et al: "Current Status of Gallium Oxide-Based Power Device Technology", 2015 IEEE Compound Semiconductor Integrated Circuit Symposium (CSICS), IEEE, Oct. 11, 2015, pp. 1-4, XP032804742, DOI: 10.1109/CSICS.2015.7314495 [retrieved on Oct. 30, 2015].
Sasaki, Kohei et al: "Ga2O3 Schottky Barrier Diodes Fabricated by Using Single-Crystal β-Ga2O3 (010) Substrates", IEEE Electron Device Letters, IEEE, USA, vol. 34, No. 4, Apr. 2013, pp. 493-495, XP011497999, ISSN: 0741-3106, DOI: 10.1109/LED.2013.2244057.
First Office Action dated Sep. 28, 2022 received from China National Intellectual Property Administration in related application 201880027299.6 together with English language translation.

* cited by examiner

GA2O3-BASED SEMICONDUCTOR DEVICE

TECHNICAL FIELD

The invention relates to a $Ga_2O_3$-based semiconductor device.

BACKGROUND ART

A technique of epitaxially growing an undoped (not containing intentionally doped dopant) $Ga_2O_3$-based crystal film on a $Ga_2O_3$-based substrate is conventionally known (e.g., Patent Literature 1).

A semiconductor device, which has an underlying substrate formed of a $Ga_2O_3$-based crystal, a buffer layer epitaxially grown on the underlying substrate and formed of an undoped $Ga_2O_3$-based crystal, and a $Ga_2O_3$-based crystal layer formed on the buffer layer and containing Si doped as a dopant, is also conventionally known (see, e.g., Non-Patent Literature 1).

CITATION LIST

Patent Literature

Patent Literature 1: JP 2017-041593 A

Non-Patent Literature

Non-Patent Literature 1: Man Hoi Wong, et al., "Anomalous Fe diffusion in Si-ion-implanted β-$Ga_2O_3$ and its suppression in $Ga_2O_3$ transistor structures through highly resistive buffer layers", Applied Physics Letters 106, 032105, 2015

SUMMARY OF INVENTION

Technical Problem $Ga_2O_3$-based crystal film, when epitaxially grown without doping, sometimes becomes n-type due to an unintentional donor. In case that such undoped $Ga_2O_3$-based crystal film is used in a semiconductor device, a problem may occur due to the undoped $Ga_2O_3$-based crystal film which became n-type.

For example, in case of FET (Field effect transistor) in which an undoped $Ga_2O_3$-based crystal film is used as a buffer layer, the FET fails to operate normally since a current also flows through the buffer layer (leakage current) in addition to through the channel layer.

For this reason, it is sometimes required to add an appropriate acceptor to the undoped $Ga_2O_3$-based crystal layer so that the unintentionally doped donor is compensated and resistance is increased. In case of an impurity which acts as an acceptor in the $Ga_2O_3$-based crystal layer, it can be also used to form a p-type region in the undoped $Ga_2O_3$-based crystal layer or in the n-type undoped $Ga_2O_3$-based crystal layer.

It is an object of the invention to provide a $Ga_2O_3$-based semiconductor device which has a $Ga_2O_3$-based crystal layer doped with a novel acceptor impurity.

Solution to Problem

To achieve the above-mentioned object, an aspect of the invention provides a $Ga_2O_3$-based semiconductor device according to [1] to [8] below.

[1] A $Ga_2O_3$-based semiconductor device, comprising a $Ga_2O_3$-based crystal layer comprising a donor, and an N (nitrogen)-doped region formed in at least a part of the $Ga_2O_3$-based crystal layer.

[2] The $Ga_2O_3$-based semiconductor device according to [1], wherein the N-doped region comprises N at a higher concentration than the donor.

[3] The $Ga_2O_3$-based semiconductor device according to [1] or [2], wherein the N-doped region is formed in a part of the $Ga_2O_3$-based crystal layer.

[4] The $Ga_2O_3$-based semiconductor device according to [1], wherein the donor is unintentionally doped to the $Ga_2O_3$-based crystal layer, and the N-doped region comprises N at a concentration not more than the concentration of the donor.

[5] The $Ga_2O_3$-based semiconductor device according to any one of [1], [2] and [4], comprising a vertical Schottky barrier diode in which the N-doped region is a current path or a guard ring.

[6] The $Ga_2O_3$-based semiconductor device according to [1] or [2], comprising a vertical MOSFET in which the N-doped region comprises a channel region or is a current blocking region comprising an opening region as a current path.

[7] The $Ga_2O_3$-based semiconductor device according to any one of [1], [2] and [4], comprising a lateral MOSFET in which the N-doped region comprises a channel region or is located between a channel region in the $Ga_2O_3$-based crystal layer and a bottom surface of the $Ga_2O_3$-based crystal layer.

[8] The $Ga_2O_3$-based semiconductor device according to any one of [1], [2] and [4], comprising a MESFET in which the N-doped region comprises a channel region or is located between a channel region in the $Ga_2O_3$-based crystal layer and a bottom surface of the $Ga_2O_3$-based crystal layer.

Advantageous Effects of Invention

According to the invention, it is possible to provide a $Ga_2O_3$-based semiconductor device which has a $Ga_2O_3$-based crystal layer doped with a novel acceptor impurity.

DESCRIPTION OF EMBODIMENTS

First Embodiment

The first embodiment is an embodiment of a Schottky barrier diode as a semiconductor device having a $Ga_2O_3$-based crystal layer in which an N-doped region is formed.

It has not been known that N (nitrogen) can be incorporated into $Ga_2O_3$-based crystal at a concentration high enough to affect the characteristics, and obviously, it has not been known that N acts as an acceptor in the $Ga_2O_3$-based crystal.

$Ga_2O_3$-based single crystal here means a $Ga_2O_3$ single crystal or is a $Ga_2O_3$ single crystal doped with an element such as Al or In, and may be, e.g., a $(Ga_xAl_yIn_{(1-x-y)})_2O_3$ ($0<x\le1$, $0\le y<1$, $0<x+y\le1$) single crystal which is a $Ga_2O_3$ single crystal doped with Al and In. The band gap is widened by adding Al and is narrowed by adding In.

Figure 1:
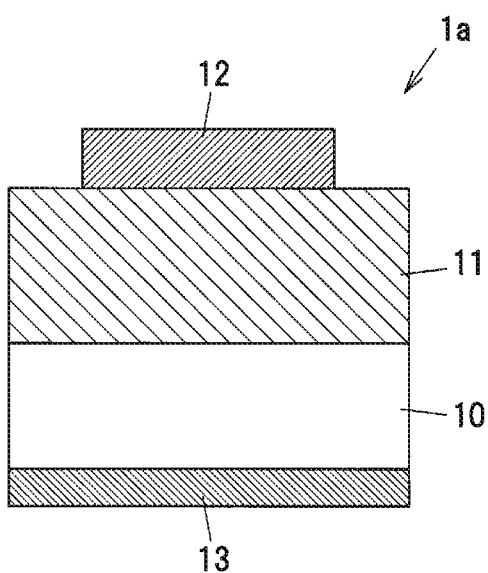
FIG. 1 is a vertical cross-sectional view showing a Schottky barrier diode in the first embodiment.

FIG. 1 is a vertical cross-sectional view showing a Schottky barrier diode 1a in the first embodiment.

The Schottky barrier diode 1a is a vertical Schottky barrier diode and has a first $Ga_2O_3$-based crystal layer 10, a second $Ga_2O_3$-based crystal layer 11 laminated on the first $Ga_2O_3$-based crystal layer 10, an anode electrode 12 connected to the second $Ga_2O_3$-based crystal layer 11, and a cathode electrode 13 connected to the first $Ga_2O_3$-based crystal layer 10.

The first $Ga_2O_3$-based crystal layer 10 is formed of an $n^+$ type $Ga_2O_3$-based single crystal containing a Group IV element, such as Si or Sn, as a donor. The donor concentration in the first $Ga_2O_3$-based crystal layer 10 is, e.g., $1\times10^{17}$ to $1\times10^{20}$ cm$^{-3}$. The thickness of the first $Ga_2O_3$-based crystal layer 10 is, e.g., 0.5 to 1000 µm.

In a typical configuration of the Schottky barrier diode 1a, the first $Ga_2O_3$-based crystal layer 10 is a $Ga_2O_3$-based substrate. The orientation of the principal plane of the first $Ga_2O_3$-based crystal layer 10 is, e.g., (010), (001) or (−201).

The second $Ga_2O_3$-based crystal layer 11 is a layer formed on the first $Ga_2O_3$-based crystal layer 10 by epitaxial crystal growth and is formed of a $Ga_2O_3$-based single crystal containing an unintentionally doped donor. The unintentionally doped donor here includes impurities as well as defects such as oxygen vacancy. The concentration of the unintentionally doped donor is, e.g., not more than $1\times10^{18}$ cm$^{-3}$. The thickness of the second $Ga_2O_3$-based crystal layer 11 is, e.g., 0.1 to 100 µm.

The second $Ga_2O_3$-based crystal layer 11 also contains an intentionally doped N which compensates the unintentionally doped donor. To reduce electron concentration, the N concentration in the second $Ga_2O_3$-based crystal layer 11 is preferably not more than the concentration of the unintentionally doped donor. N is doped during crystal growth of the second $Ga_2O_3$-based crystal layer 11 (in-situ doping), hence, the entire second $Ga_2O_3$-based crystal layer 11 is the N-doped region. However, when, e.g., a Group IV element as a donor, such as Si or Sn, is intentionally doped simultaneously with addition of N, the N concentration may be higher than the concentration of the unintentionally doped donor.

The second $Ga_2O_3$-based crystal layer 11 is formed by, e.g., Molecular-beam epitaxy method (MBE method) performed using a Ga metal and an ozone gas made from an $O_2$—$N_2$ gas mixture.

The anode electrode 12 has, e.g., a stacked structure of Pt/Ti/Au and is in Schottky contact with the second $Ga_2O_3$-based crystal layer 11.

The cathode electrode 13 has, e.g., a stacked structure of Ti/Au and is in ohmic contact with the first $Ga_2O_3$-based crystal layer 10.

In the Schottky barrier diode 1a, an energy barrier between the anode electrode 12 and the second $Ga_2O_3$-based crystal layer 11 as viewed from the second $Ga_2O_3$-based crystal layer 11 is lowered by applying forward voltage between the anode electrode 12 and the cathode electrode 13 (positive potential on the anode electrode 12 side), allowing a current flow from the anode electrode 12 to the cathode electrode 13. Thus, the second $Ga_2O_3$-based crystal layer 11, which is entirely formed of the N-doped region, serves as a current path. On the other hand, when reverse voltage is applied between the anode electrode 12 and the cathode electrode 13 (negative potential on the anode electrode 12 side), the current flow is interrupted by the Schottky barrier.

Figure 2:
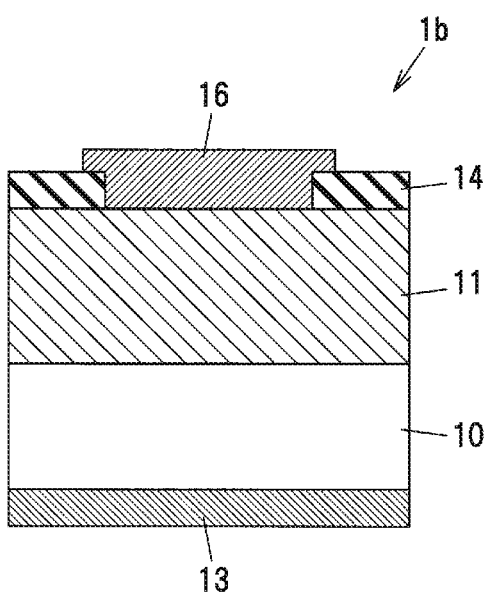
FIG. 2 is a vertical cross-sectional view showing a Schottky barrier diode in the first embodiment.

FIG. 2 is a vertical cross-sectional view showing a Schottky barrier diode 1b in the first embodiment. The Schottky barrier diode 1b is different from the Schottky barrier diode 1a in that it has a field-plate structure.

In the Schottky barrier diode 1b, an insulating film 14 formed of $SiO_2$, etc., is provided on an upper surface of the second $Ga_2O_3$-based crystal layer 11 along the periphery of an anode electrode 16 which is arranged so that the edge thereof rides on the insulating film 14.

By providing such field-plate structure, it is possible to prevent the electric field from concentrating at the edge portion of the anode electrode 16. The insulating film 14 also serves as a passivation film for preventing a surface leakage current which flows along the upper surface of the second $Ga_2O_3$-based crystal layer 11.

Figure 3:
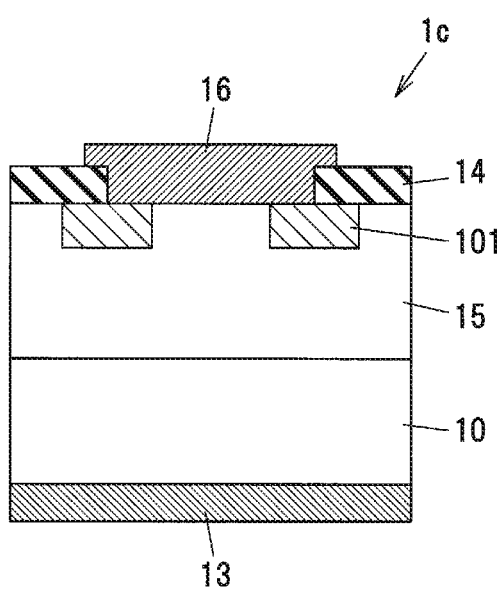
FIG. 3 is a vertical cross-sectional view showing a Schottky barrier diode in the first embodiment.

FIG. 3 is a vertical cross-sectional view showing a Schottky barrier diode 1c in the first embodiment.

The Schottky barrier diode 1c is different from the Schottky barrier diode 1b in that it has a guard ring structure. In the Schottky barrier diode 1c, an N-doped region 101 as a guard ring is formed in a second $Ga_2O_3$-based crystal layer 15 in the vicinity of the upper surface thereof. In other words, the N-doped region 101 is formed in a part of the second $Ga_2O_3$-based crystal layer 15.

The second $Ga_2O_3$-based crystal layer 15 is formed of an n⁻ type $Ga_2O_3$-based single crystal containing a Group IV element, such as Si or Sn, as a donor. The donor concentration in the second $Ga_2O_3$-based crystal layer 15 is, e.g., not more than $1 \times 10^{18}$ cm⁻³. The thickness of the second $Ga_2O_3$-based crystal layer 15 is, e.g., 0.1 to 100 μm.

The N-doped region 101 is formed by, e.g., selectively implanting N ions into the upper surface of the second $Ga_2O_3$-based crystal layer 15 in a region partially overlapping the anode electrode 16. The N concentration in the N-doped region 101 is higher than the donor concentration in the second $Ga_2O_3$-based crystal layer 15. By providing such a guard ring structure, it is possible to reduce concentration of the electric field at the edge portion of the anode electrode 16.

Second Embodiment

The second embodiment is an embodiment of a vertical MOSFET (Metal-Oxide-Semiconductor Field Effect Transistor) as a semiconductor device having a $Ga_2O_3$-based crystal layer in which an N-doped region is formed.

Figure 4:
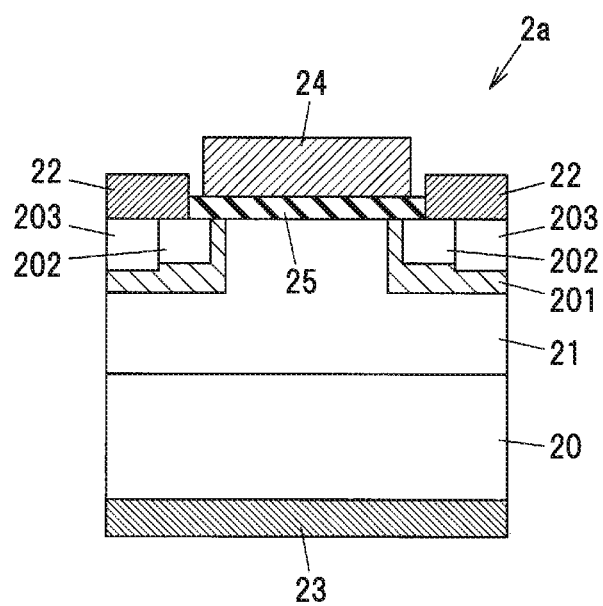
FIG. 4 is a vertical cross-sectional view showing a vertical MOSFET in the second embodiment.

FIG. 4 is a vertical cross-sectional view showing a vertical MOSFET 2a in the second embodiment.

The vertical MOSFET 2a has a first $Ga_2O_3$-based crystal layer 20, a second $Ga_2O_3$-based crystal layer 21 laminated on the first $Ga_2O_3$-based crystal layer 20, a gate electrode 24 formed on the second $Ga_2O_3$-based crystal layer 21 via a gate insulating film 25, n⁺ regions 202 formed in the second $Ga_2O_3$-based crystal layer 21 in the vicinity of the upper surface on both sides of the gate electrode 24, p⁺ regions 203 formed on the outer side of the n⁺ regions 202, an N-doped region 201 surrounding the n⁺ regions 202 and the p⁺ regions 203, a source electrode 22 connected to the n⁺ regions 202 and the p⁺ regions 203, and a drain electrode 23 formed on a surface of the first $Ga_2O_3$-based crystal layer 20 opposite to the second $Ga_2O_3$-based crystal layer 21.

The vertical MOSFET 2a is a vertical enhancement-mode (normally-off) MOSFET. When voltage of over a threshold is applied to the gate electrode 24, an inversion channel is formed in the N-doped region 201 under the gate electrode 24, allowing a current flow from the drain electrode 23 to the source electrode 22. That is, the N-doped region 201 includes a channel region (a region in which a channel is formed).

The first $Ga_2O_3$-based crystal layer 20 is formed of an n⁺ type $Ga_2O_3$-based single crystal containing a Group IV element, such as Si or Sn, as a donor. The donor concentration in the first $Ga_2O_3$-based crystal layer 20 is, e.g., $1 \times 10^{17}$ to $1 \times 10^{20}$ cm⁻³. The thickness of the first $Ga_2O_3$-based crystal layer 20 is, e.g., 0.5 to 1000 μm.

In a typical configuration of the vertical MOSFET 2a, the first $Ga_2O_3$-based crystal layer 20 is a $Ga_2O_3$-based substrate. The orientation of the principal plane of the first $Ga_2O_3$-based crystal layer 20 is, e.g., (010), (001) or (−201).

The second $Ga_2O_3$-based crystal layer 21 is formed of an n⁻ type $Ga_2O_3$-based single crystal containing a Group IV element, such as Si or Sn, as a donor. The donor concentration in the second $Ga_2O_3$-based crystal layer 21 is, e.g., not more than $1 \times 10^{18}$ cm⁻³. The thickness of the second $Ga_2O_3$-based crystal layer 21 is, e.g., 1 to 100 μm.

The source electrode 22, the drain electrode 23 and the gate electrode 24 are formed of, e.g., Ti/Au. The gate insulating film 25 is formed of an insulating material such as $SiO_2$.

The n⁺ region 202 is a region with a high n-type dopant concentration formed in the second $Ga_2O_3$-based crystal layer 21 by ion implantation, etc. The p⁺ region 203 is a region with a high p-type dopant concentration formed by burying of a p-type material or ion implantation, etc., into the second $Ga_2O_3$-based crystal layer 21.

The N-doped region 201 is a region which is formed by ion implantation, etc., and surrounds the n⁺ regions 202 and the p⁺ regions 203. In other words, the N-doped region 201 is formed in a part of the second $Ga_2O_3$-based crystal layer 21. The N concentration in the N-doped region 201 is higher than the donor concentration in the second $Ga_2O_3$-based crystal layer 21 (the region except the n⁺ regions 202 and the p⁺ regions 203).

Figure 5:
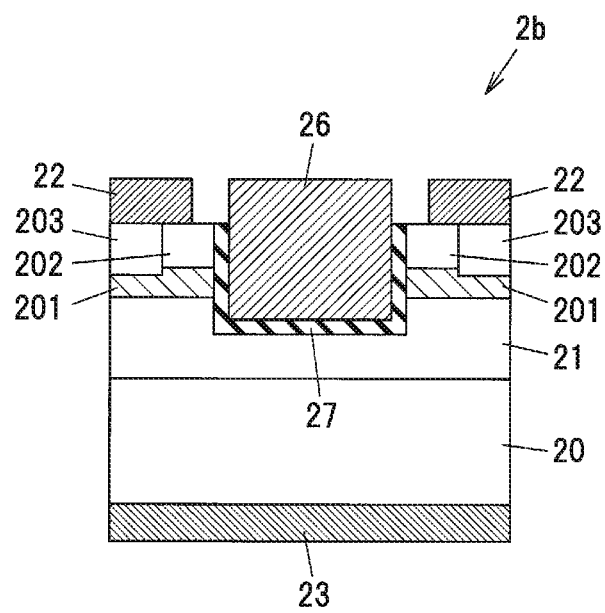
FIG. 5 is a vertical cross-sectional view showing a vertical MOSFET in the second embodiment.

FIG. 5 is a vertical cross-sectional view showing a vertical MOSFET 2b in the second embodiment. The vertical MOSFET 2b is different from the vertical MOSFET 2a in that it is a vertical trench MOSFET with the gate electrode embedded in the second $Ga_2O_3$-based crystal layer.

In the vertical MOSFET 2b, a gate electrode 26 is covered with a gate insulating film 27 and is embedded in the second $Ga_2O_3$-based crystal layer 21, and the N-doped region 201, the n⁺ regions 202 and the p⁺ regions 203 are located on both sides of the gate electrode 26.

The vertical MOSFET 2b is a vertical enhancement-mode MOSFET. When voltage of over a threshold is applied to the gate electrode 26, an inversion channel is formed in the N-doped region 201 on the lateral side of the gate electrode 26, allowing a current flow from the drain electrode 23 to the source electrode 22. That is, the N-doped region 201 includes a channel region.

Figure 6:
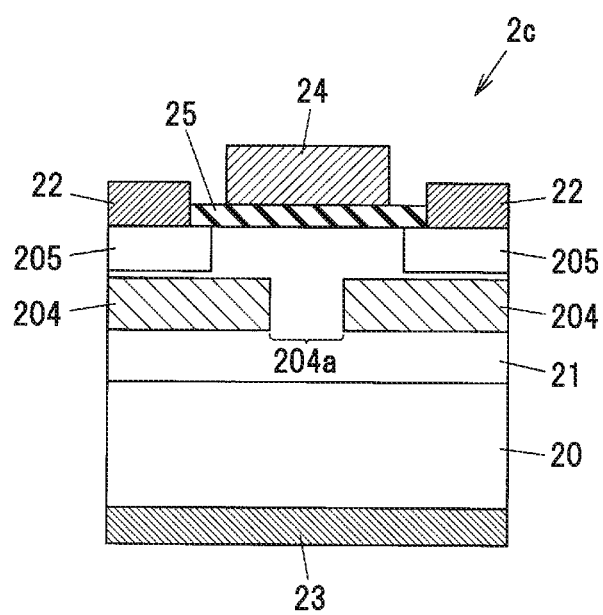
FIG. 6 is a vertical cross-sectional view showing a vertical MOSFET in the second embodiment.

FIG. 6 is a vertical cross-sectional view showing a vertical MOSFET 2c in the second embodiment. The vertical MOSFET 2c is different from the vertical MOSFET 2a in that it is a vertical depletion-mode (normally-on) MOSFET in which a current blocking layer is formed.

In the vertical MOSFET 2c, n⁺regions 205 are formed in the second $Ga_2O_3$-based crystal layer 21 in the vicinity of the upper surface on both sides of the gate electrode 24, and an N-doped region 204 as a current blocking region having an opening region is formed in a portion of the second $Ga_2O_3$-based crystal layer 21 below the n⁺ regions 205.

The n⁺ region 205 is a region with a high n-type dopant concentration formed in the second $Ga_2O_3$-based crystal layer 21 by ion implantation, etc.

The N-doped region 204 is formed in a portion below the n⁺ regions 205 by ion implantation, etc. A region 204a located below the gate electrode 24 and surrounded by the N-doped region 204 is an opening region of the current blocking region and serves as a current path. That is, the N-doped region 204 is formed in a part of the second $Ga_2O_3$-based crystal layer 21. The N concentration in the N-doped region 204 is higher than the donor concentration in the second $Ga_2O_3$-based crystal layer 21 (the region except the n⁺ regions 205).

The vertical MOSFET 2c is a vertical depletion-mode MOSFET, as described above. The current can flow from the drain electrode 23 to the source electrode 22 in a state that no voltage or voltage of over a threshold is applied to the gate electrode 24, but when voltage of less than the threshold is applied to the gate electrode 24, the channel is partially closed, allowing the current to be turned off.

Third Embodiment

The third embodiment is an embodiment of a lateral MOSFET as a semiconductor device having a $Ga_2O_3$-based crystal layer in which an N-doped region is formed.

Figure 7:
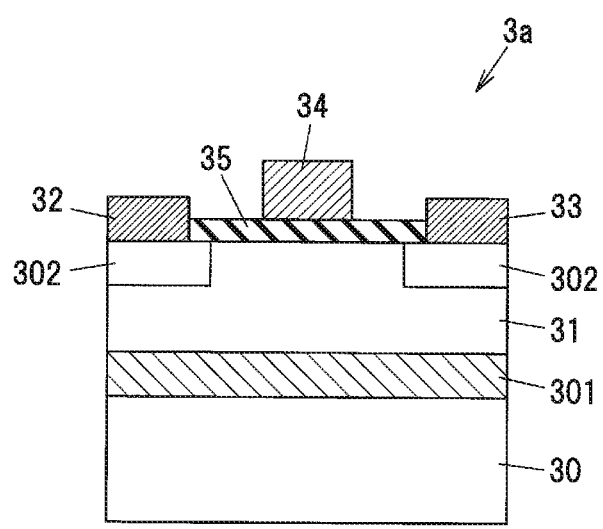
FIG. 7 is a vertical cross-sectional view showing a lateral MOSFET in the third embodiment.

FIG. 7 is a vertical cross-sectional view showing a lateral MOSFET 3a in the third embodiment.

The lateral MOSFET 3a has a first $Ga_2O_3$-based crystal layer 30, a second $Ga_2O_3$-based crystal layer 31 laminated on the first $Ga_2O_3$-based crystal layer 30, a source electrode 32 and a drain electrode 33 which are formed on the second $Ga_2O_3$-based crystal layer 31, a gate electrode 34 formed on the second $Ga_2O_3$-based crystal layer 31 via a gate insulating film 35 in a region between the source electrode 32 and the drain electrode 33, $n^+$ regions 302 formed in the second $Ga_2O_3$-based crystal layer 31 in the vicinity of the upper surface on both sides of the gate electrode 34 and respectively connected to the source electrode 32 and the drain electrode 33, and an N-doped region 301 formed in the second $Ga_2O_3$-based crystal layer 31 between the $n^+$ regions 302 and the first $Ga_2O_3$-based crystal layer 30 so as to be continuous in an in-plane direction.

The lateral MOSFET 3a is a lateral depletion-mode MOSFET. The current can flow from the drain electrode 33 to the source electrode 32 in a state that no voltage is applied to the gate electrode 34, but when voltage of less than the threshold is applied to the gate electrode 34, a depletion layer expands and this causes the channel between the two $n^+$ regions 302 to be narrowed, resulting in interruption of the current flow.

The first $Ga_2O_3$-based crystal layer 30 is a semi-insulating layer to which an acceptor impurity such as Fe is intentionally doped at a concentration higher than the donor concentration. Resistivity of the first $Ga_2O_3$-based crystal layer 30 is, e.g., larger than $1 \times 10^{10}$ Ωcm. The thickness of the first $Ga_2O_3$-based crystal layer 30 is, e.g., 0.5 to 1000 μm.

In a typical configuration of the lateral MOSFET 3a, the first $Ga_2O_3$-based crystal layer 30 is a $Ga_2O_3$-based substrate. The orientation of the principal plane of the first $Ga_2O_3$-based crystal layer 30 is, e.g., (010), (001) or (−201).

The second $Ga_2O_3$-based crystal layer 31 is formed of an $n^-$ type $Ga_2O_3$-based single crystal containing a Group IV element, such as Si or Sn, as a donor. The donor concentration in the second $Ga_2O_3$-based crystal layer 31 is, e.g., $1 \times 10^{16}$ to $5 \times 10^{19}$ cm$^{-3}$. The thickness of the second $Ga_2O_3$-based crystal layer 31 is, e.g., 0.02 to 100 μm. The source electrode 32, the drain electrode 33 and the gate electrode 34 are formed of, e.g., Ti/Au. The gate insulating film 35 is formed of an insulating material such as $SiO_2$.

The $n^+$ region 302 is a region with a high n-type dopant concentration formed in the second $Ga_2O_3$-based crystal layer 31 by ion implantation, etc.

The N-doped region 301 is formed by ion implantation, etc., at a position blocking between a channel, which is formed between the two $n^+$ regions 302, and an interface formed between the second $Ga_2O_3$-based crystal layer 31 and the first $Ga_2O_3$-based crystal layer 30. In other words, the N-doped region 301 is formed between the channel region, which is formed in the second $Ga_2O_3$-based crystal layer 31 and is a part of the second $Ga_2O_3$-based crystal layer 31, and a bottom surface of the second $Ga_2O_3$-based crystal layer 31. Thus, the N-doped region 301 can prevent a leakage current which flows through the interface between the second $Ga_2O_3$-based crystal layer 31 and the first $Ga_2O_3$-based crystal layer 30. The N concentration in the N-doped region 301 is higher than the donor concentration in the second $Ga_2O_3$-based crystal layer 31 (the region except the $n^+$ regions 302).

Figure 8:
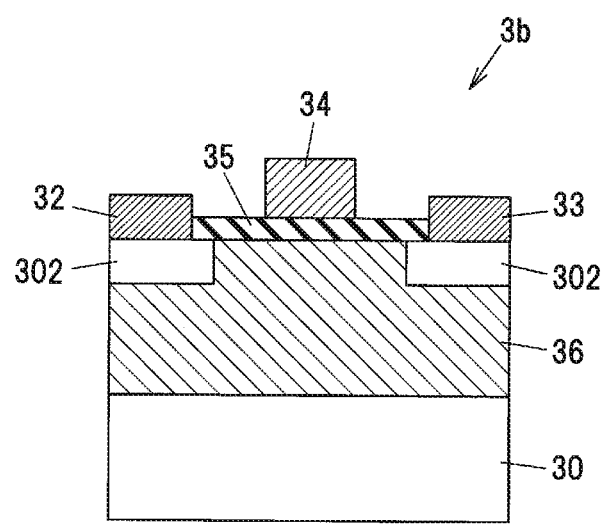
FIG. 8 is a vertical cross-sectional view showing a lateral MOSFET in the third embodiment.

FIG. 8 is a vertical cross-sectional view showing a lateral MOSFET 3b in the third embodiment. The lateral MOSFET 3b is different from the lateral MOSFET 3a in that the N-doped region is formed in the entire second $Ga_2O_3$-based crystal layer.

A second $Ga_2O_3$-based crystal layer 36 of the lateral MOSFET 3b is a layer formed on the first $Ga_2O_3$-based crystal layer 30 by epitaxial crystal growth and is formed of a $Ga_2O_3$-based single crystal containing an unintentionally doped donor. The concentration of the unintentionally doped donor is, e.g., not more than $1 \times 10^{18}$ cm$^{-3}$. The thickness of the second $Ga_2O_3$-based crystal layer 36 is, e.g., 0.02 to 100 μm.

The second $Ga_2O_3$-based crystal layer 36 also contains an intentionally doped N which compensates the unintentionally doped donor. To reduce electron concentration, the N concentration in the second $Ga_2O_3$-based crystal layer 36 is preferably not more than the concentration of the unintentionally doped donor. N is doped during crystal growth of the second $Ga_2O_3$-based crystal layer 36, hence, the entire second $Ga_2O_3$-based crystal layer 36 is the N-doped region. Alternatively, N may be doped to the second $Ga_2O_3$-based crystal layer 36 by ion implantation. When, e.g., a Group IV element as a donor, such as Si or Sn, is intentionally doped simultaneously with addition of N, the N concentration may be higher than the concentration of the unintentionally doped donor.

The lateral MOSFET 3b is a lateral depletion-mode MOSFET. The current can flow from the drain electrode 33 to the source electrode 32 in a state that no voltage is applied to the gate electrode 34, but when voltage of not more than the threshold is applied to the gate electrode 34, a depletion layer expands and this causes the channel between the two $n^+$ regions 302 to be narrowed, resulting in interruption of the current flow. That is, the N-doped region formed in the entire second $Ga_2O_3$-based crystal layer 36 includes a channel region.

Figure 9:
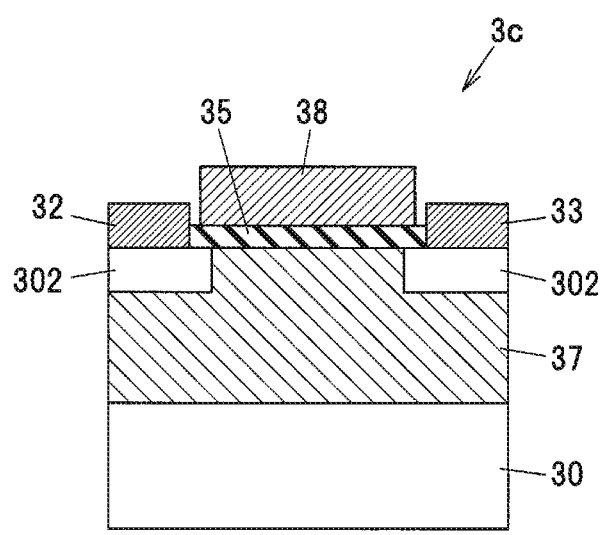
FIG. 9 is a vertical cross-sectional view showing a lateral MOSFET in the third embodiment.

FIG. 9 is a vertical cross-sectional view showing a lateral MOSFET 3c in the third embodiment. The lateral MOSFET 3c is different from the lateral MOSFET 3b in that it is an enhancement-mode device.

A second $Ga_2O_3$-based crystal layer 37 of the lateral MOSFET 3c is a layer formed on the first $Ga_2O_3$-based crystal layer 30 by epitaxial crystal growth and is formed of a $Ga_2O_3$-based single crystal containing an unintentionally doped donor. The concentration of the unintentionally doped donor is, e.g., not more than $1 \times 10^{18}$ cm$^{-3}$. The thickness of the second $Ga_2O_3$-based crystal layer 37 is, e.g., 0.02 to 100 μm.

The second $Ga_2O_3$-based crystal layer 37 also contains an intentionally doped N which compensates the unintentionally doped donor. The N concentration in the second $Ga_2O_3$-based crystal layer 37 is preferably higher than the concentration of the unintentionally doped donor. N is doped during crystal growth of the second $Ga_2O_3$-based crystal layer 37, hence, the entire second $Ga_2O_3$-based crystal layer 37 is the N-doped region. Alternatively, N may be doped to the second $Ga_2O_3$-based crystal layer 37 by ion implantation.

A gate electrode 38 of the lateral MOSFET 3c overlaps with, or is located very close to, end portions of the $n^+$ regions 302 so that a continuous channel region is formed between the source electrode 32 and the drain electrode 33.

The lateral MOSFET 3c is a lateral enhancement-mode MOSFET. When voltage of over a threshold is applied to the gate electrode 38, a channel is formed between the two n+ regions 302 in the vicinity of the upper surface of the second $Ga_2O_3$-based crystal layer 37, allowing a current flow from the drain electrode 33 to the source electrode 32. That is, the N-doped region formed in the entire second $Ga_2O_3$-based crystal layer 37 includes a channel region.

Figure 10:
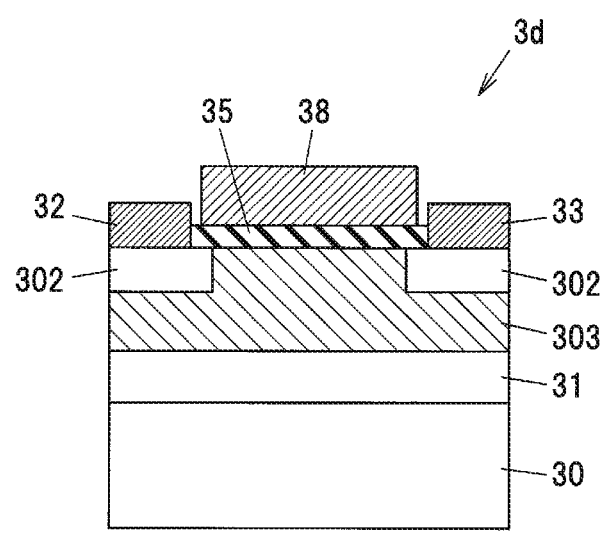
FIG. 10 is a vertical cross-sectional view showing a lateral MOSFET in the third embodiment.

FIG. 10 is a vertical cross-sectional view showing a lateral MOSFET 3d in the third embodiment. The lateral MOSFET 3d is different from the lateral MOSFET 3c in that the N-doped region is formed only in a portion of the second $Ga_2O_3$-based crystal layer on the upper side.

An N-doped region 303 of the lateral MOSFET 3d is formed in the second $Ga_2O_3$-based crystal layer 31 by ion implantation, etc., in an upper region including the n+ regions 302. That is, the N-doped region 303 is formed in a part of the second $Ga_2O_3$-based crystal layer 31. The N concentration in the N-doped region 303 is higher than the donor concentration in the second $Ga_2O_3$-based crystal layer 31 (the region except the n+ regions 302).

The lateral MOSFET 3d is a lateral enhancement-mode MOSFET, in the same manner as the lateral MOSFET 3c. When voltage of over a threshold is applied to the gate electrode 38, a channel is formed between the two n+ regions 302 in the vicinity of the upper surface of the second $Ga_2O_3$-based crystal layer 31 (the N-doped region 303), allowing a current flow from the drain electrode 33 to the source electrode 32. That is, the N-doped region 303 includes a channel region.

Fourth Embodiment

The fourth embodiment is an embodiment of a lateral MESFET (Metal-Semiconductor Field Effect Transistor) as a semiconductor device having a $Ga_2O_3$-based crystal layer in which an N-doped region is formed.

Figure 11:
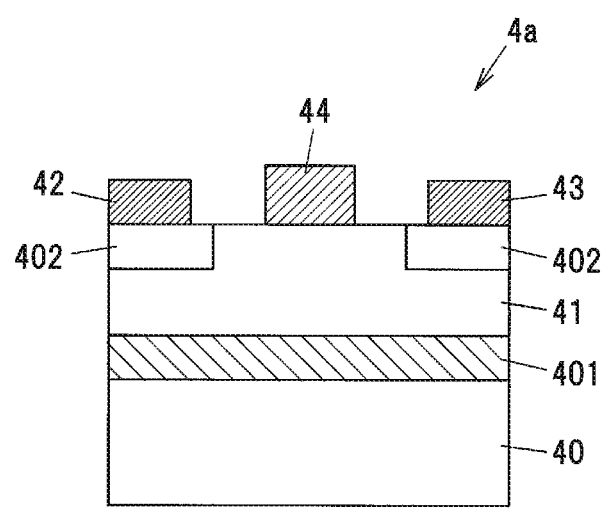
FIG. 11 is a vertical cross-sectional view showing a MESFET in the fourth embodiment.

FIG. 11 is a vertical cross-sectional view showing a MESFET 4a in the fourth embodiment.

The MESFET 4a has a first $Ga_2O_3$-based crystal layer 40, a second $Ga_2O_3$-based crystal layer 41 laminated on the first $Ga_2O_3$-based crystal layer 40, a source electrode 42 and a drain electrode 43 which are formed on the second $Ga_2O_3$-based crystal layer 41, a gate electrode 44 formed on the second $Ga_2O_3$-based crystal layer 41 in a region between the source electrode 42 and the drain electrode 43, n+ regions 402 formed in the second $Ga_2O_3$-based crystal layer 41 in the vicinity of the upper surface on both sides of the gate electrode 44 and respectively connected to the source electrode 42 and the drain electrode 43, and an N-doped region 401 formed in the second $Ga_2O_3$-based crystal layer 41 between the n+ regions 402 and the first $Ga_2O_3$-based crystal layer 40 so as to be continuous in an in-plane direction.

The gate electrode 44 is in Schottky contact with the upper surface of the second $Ga_2O_3$-based crystal layer 41 and a depletion layer is formed in the second $Ga_2O_3$-based crystal layer 41 under the gate electrode 44. The MESFET 4a functions as either a depletion-mode transistor or an enhancement-mode transistor depending on the thickness of the depletion region.

The first $Ga_2O_3$-based crystal layer 40 is a semi-insulating layer to which an acceptor impurity such as Fe is intentionally doped at a concentration higher than the donor concentration. Resistivity of the first $Ga_2O_3$-based crystal layer 40 is, e.g., not less than $1\times10^{10}$ Ωcm. The thickness of the first $Ga_2O_3$-based crystal layer 40 is, e.g., 0.5 to 1000 μm.

In a typical configuration of the MESFET 4a, the first $Ga_2O_3$-based crystal layer 40 is a $Ga_2O_3$-based substrate. The orientation of the principal plane of the first $Ga_2O_3$-based crystal layer 40 is, e.g., (010), (001) or (−201).

The second $Ga_2O_3$-based crystal layer 41 is formed of an n− type $Ga_2O_3$-based single crystal containing a Group IV element, such as Si or Sn, as a donor. The donor concentration in the second $Ga_2O_3$-based crystal layer 41 is, e.g., $1\times10^{16}$ to $5\times10^{19}$ cm$^{-3}$. The thickness of the second $Ga_2O_3$-based crystal layer 41 is, e.g., 0.02 to 100 μm.

The source electrode 42 and the drain electrode 43 are formed of, e.g., Ti/Au. The gate electrode 44 is formed of, e.g., Pt/Ti/Au.

The n+ region 402 is a region with a high n-type dopant concentration formed in the second $Ga_2O_3$-based crystal layer 41 by ion implantation, etc.

The N-doped region 401 is formed by ion implantation, etc., at a position blocking between a channel, which is formed between the two n+ regions 402, and an interface formed between the second $Ga_2O_3$-based crystal layer 41 and the first $Ga_2O_3$-based crystal layer 40. In other words, the N-doped region 401 is formed between the channel region, which is formed in the second $Ga_2O_3$-based crystal layer 41 and is a part of the second $Ga_2O_3$-based crystal layer 41, and a bottom surface of the second $Ga_2O_3$-based crystal layer 41. Thus, the N-doped region 401 can prevent a leakage current which flows through the interface between the second $Ga_2O_3$-based crystal layer 41 and the first $Ga_2O_3$-based crystal layer 40. The N concentration in the N-doped region 401 is higher than the donor concentration in the second $Ga_2O_3$-based crystal layer 41 (the region except the n+ regions 402).

Figure 12:
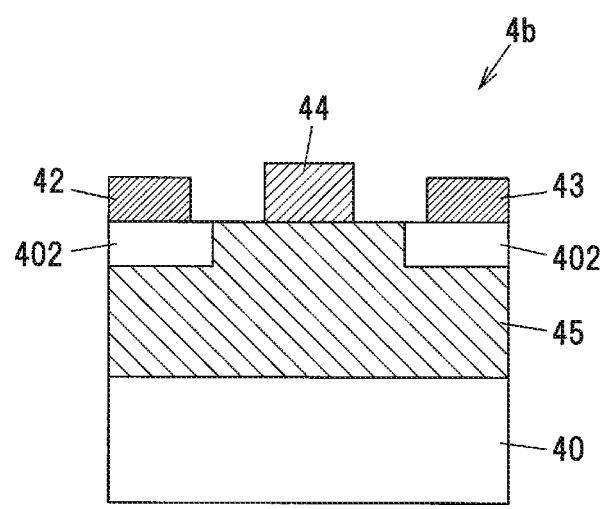
FIG. 12 is a vertical cross-sectional view showing a MESFET in the fourth embodiment.

FIG. 12 is a vertical cross-sectional view showing a MESFET 4b in the fourth embodiment. The MESFET 4b is different from the MESFET 4a in that the N-doped region is formed in the entire second $Ga_2O_3$-based crystal layer.

A second $Ga_2O_3$-based crystal layer 45 of the MESFET 4b is a layer formed on the first $Ga_2O_3$-based crystal layer 40 by epitaxial crystal growth and is formed of a $Ga_2O_3$-based single crystal containing an unintentionally doped donor. The concentration of the unintentionally doped donor is, e.g., not more than $1\times10^{18}$ cm$^{-3}$. The thickness of the second $Ga_2O_3$-based crystal layer 45 is, e.g., 0.02 to 100 μm.

The second $Ga_2O_3$-based crystal layer 45 also contains an intentionally doped N which compensates the unintentionally doped donor. To reduce electron concentration, the N concentration in the second $Ga_2O_3$-based crystal layer 45 is preferably not more than the concentration of the unintentionally doped donor. N is doped during crystal growth of the second $Ga_2O_3$-based crystal layer 45, hence, the entire second $Ga_2O_3$-based crystal layer 45 is the N-doped region. Alternatively, N may be doped to the second $Ga_2O_3$-based crystal layer 45 by ion implantation. When, e.g., a Group IV element as a donor, such as Si or Sn, is intentionally doped simultaneously with addition of N, the N concentration may be higher than the concentration of the unintentionally doped donor.

The gate electrode 44 is in Schottky contact with the upper surface of the second $Ga_2O_3$-based crystal layer 45 and a depletion layer is formed in the second $Ga_2O_3$-based crystal layer 45 under the gate electrode 44. The MESFET 4b functions as either a depletion-mode transistor or an enhancement-mode transistor depending on the thickness of the depletion region.

Effects of the Embodiments

According to the first to fourth embodiments, it is possible to increase resistance of $Ga_2O_3$-based crystal or to form a p-type region by using N which has not been known as an acceptor in the $Ga_2O_3$-based crystal. It is also possible to provide a semiconductor device having a $Ga_2O_3$-based crystal layer doped with such N.

Example 1

Experiments confirmed that N doped to $Ga_2O_3$-based crystal acts as an acceptor.

Figure 13:
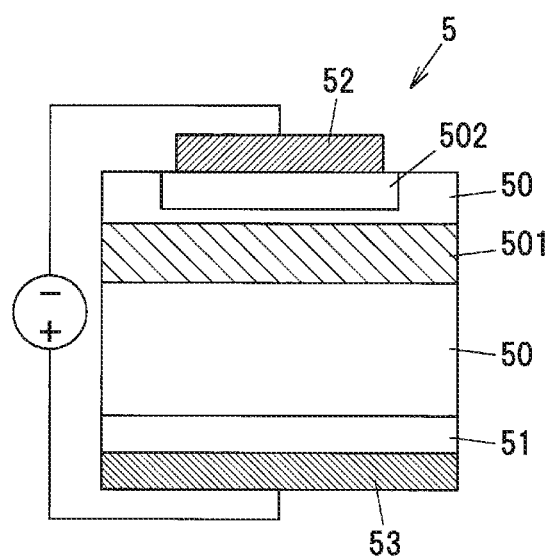
FIG. 13 is a vertical cross-sectional view showing a sample device used in experiments in Example 1.

FIG. 13 is a vertical cross-sectional view showing a sample device 5 used in experiments in Example 1. The sample device 5 has a $Ga_2O_3$ single crystal substrate 50 containing an unintentionally doped donor, an $n^+$ type $Ga_2O_3$ single crystal layer 51 laminated on the $Ga_2O_3$ single crystal substrate 50, an N-doped region 501 formed in the $Ga_2O_3$ single crystal substrate 50, an $n^+$ region 502 formed in the $Ga_2O_3$ single crystal substrate 50 in the vicinity of the upper surface (a surface opposite to the $Ga_2O_3$ single crystal layer 51), an electrode 52 having a Ti/Au laminated structure and ohmic-connected to the $n^+$ region 502 of the $Ga_2O_3$ single crystal substrate 50, and an electrode 53 having a Ti/Au laminated structure and ohmic-connected to the $Ga_2O_3$ single crystal layer 51.

The concentration of the unintentionally doped donor in the $Ga_2O_3$ single crystal substrate 50 is about $3\times10^{17}$ $cm^{-3}$. The orientation of the principal plane of the $Ga_2O_3$ single crystal substrate 50 is (001).

The N-doped region 501 was formed by ion implantation of N into a layer-shaped region of the $Ga_2O_3$ single crystal substrate 50 located at a depth of 600 to 700 nm from the upper surface under the implantation conditions of $4\times10^{13}$ $cm^{-2}$ at 480 keV. In addition, after the ion implantation, annealing was performed in an $N_2$ atmosphere at 800 to 1200° C. for 30 minutes to activate the doped N and to recover damage of the $Ga_2O_3$ single crystal substrate 50 caused by the ion implantation. The maximum concentration of N in the N-doped region 501 was $1.5\times10^{18}$ $cm^{-3}$.

The $n^+$ region 502 was formed by ion implantation of Si into the $Ga_2O_3$ single crystal substrate 50 in the vicinity of the upper surface. After the ion implantation, annealing was performed in an $N_2$ atmosphere at 800° C. for 30 minutes to activate the doped Si.

Voltage was applied between the electrode 52 and the electrode 53 of the sample device 5 and the magnitude of vertical leakage current was measured. The result confirmed that N in the N-doped region 501 is acting as an acceptor.

Figure 14:
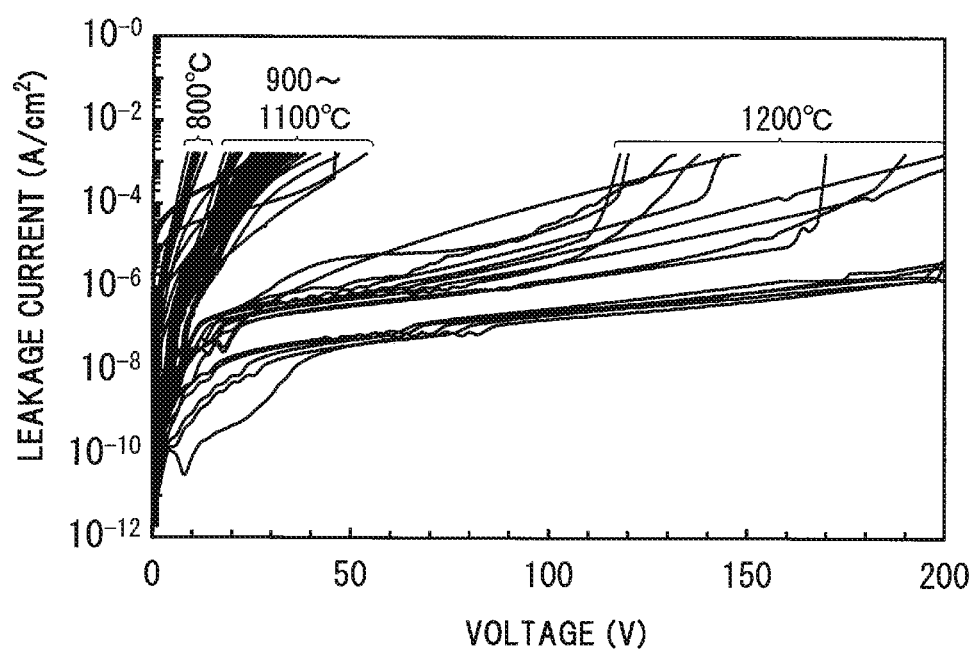
FIG. 14 is a graph showing measured leakage characteristics of the sample device.

FIG. 14 is a graph showing measured leakage characteristics of the sample device 5. FIG. 14 shows that leakage current decreases with an increase in an annealing temperature from 800° C. to 1200° C. With an annealing temperature of 1200° C., the minimum value of leakage current at a voltage of 200V was 1 to 10 $\mu A/cm^2$. This confirmed that N in the N-doped region 501 is acting as an acceptor.

Example 2

The Schottky barrier diode 1a in the first embodiment was made, and a relation between the N concentration in the second $Ga_2O_3$-based crystal layer 11 entirely formed of the N-doped region and electrical conduction properties of the Schottky barrier diode 1a.

In Example 2, an Sn-doped $n^+$ type $Ga_2O_3$ single crystal substrate having a (001) plane as a principal plane was used as the first $Ga_2O_3$-based crystal layer 10. Si with a concentration of $5\times10^{19}$ $cm^{-3}$ was ion-implanted into the back surface of the first $Ga_2O_3$-based crystal layer 10 to form a 150 nm deep box profile for an ohmic contact with the cathode electrode 13.

Then, a 2.6 $\mu m$-thick N-doped $Ga_2O_3$ single crystal was homoepitaxially grown on the first $Ga_2O_3$-based crystal layer 10 by MBE using a Ga metal and an ozone gas made from an $O_2$—$N_2$ gas mixture, thereby forming the second $Ga_2O_3$-based crystal layer 11.

Then, a 200 $\mu m$-diameter circular electrode having a Pt/Ti/Au stacked structure was formed as the anode electrode 12. An electrode having a Ti/Au stacked structure was formed as the cathode electrode 13.

Firstly, to make sure that the second $Ga_2O_3$-based crystal layer 11 was doped with N, secondary-ion mass spectrometry (SIMS) measurement was performed on a sample device without the anode electrode 12 and the cathode electrode 13.

Figure 15A:
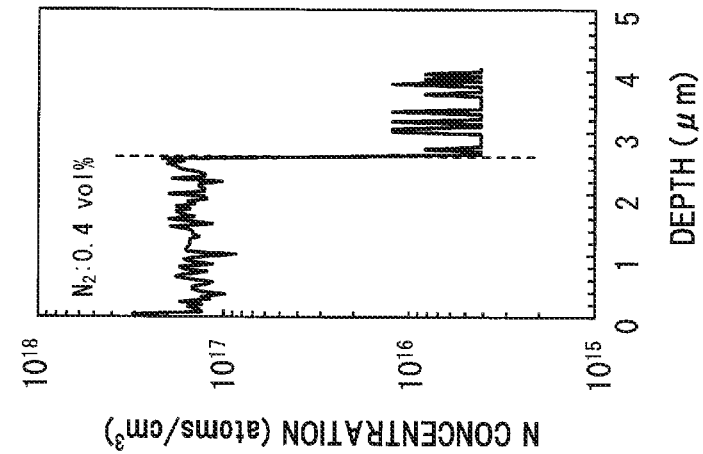
FIG. 15A is a SIMS depth profile of N density in a second $Ga_2O_3$-based crystal layer when a $N_2$ gas concentration in an $O_2$—$N_2$ gas mixture used for growth of the second $Ga_2O_3$-based crystal layer is 0 vol %.
Figure 15B:
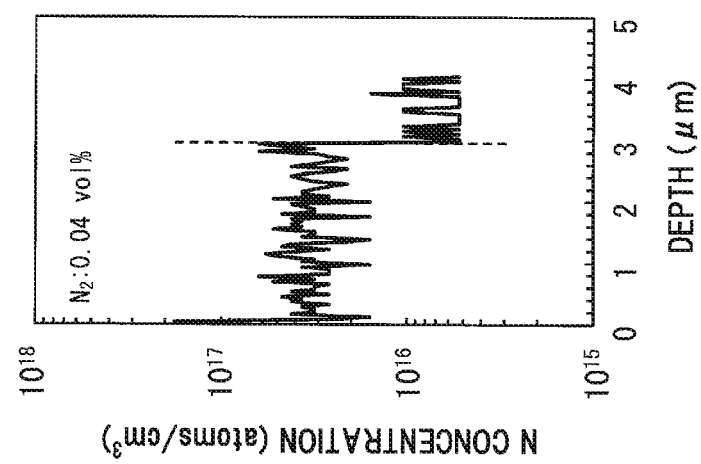
FIG. 15B is a SIMS depth profile of N density in the second $Ga_2O_3$-based crystal layer when the $N_2$ gas concentration in the $O_2$—$N_2$ gas mixture used for growth of the second $Ga_2O_3$-based crystal layer is 0.04 vol %.
Figure 15C:
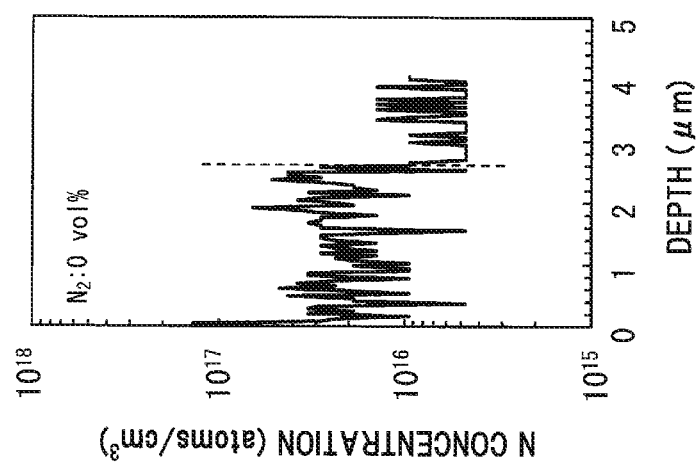
FIG. 15C is a SIMS depth profile of N density in the second $Ga_2O_3$-based crystal layer when the $N_2$ gas concentration in the $O_2$—$N_2$ gas mixture used for growth of the second $Ga_2O_3$-based crystal layer is 0.4 vol %.

FIGS. 15A, 15B and 15C show SIMS profiles of N in the second $Ga_2O_3$-based crystal layer 11 when an $N_2$ gas concentration in an $O_2$—$N_2$ gas mixture used for growth of the second $Ga_2O_3$-based crystal layer 11 is respectively 0 vol %, 0.04 vol % and 0.4 vol %. In the drawings, a profile shown in a region shallower than the depth indicated by a dotted line (a region on the left side of the dotted line) is from the second $Ga_2O_3$-based crystal layer 11, and a profile shown in a region deeper than the depth indicated by the dotted line (a region on the right side of the dotted line) is from the first $Ga_2O_3$-based crystal layer 10.

As shown in FIGS. 15A, 15B and 15C, the N concentration in the second $Ga_2O_3$-based crystal layer 11, when the $N_2$ gas concentration in the $O_2$—$N_2$ gas mixture is 0 vol %, 0.04 vol % and 0.4 vol %, was respectively $2.5\times10^{16}$ $cm^{-3}$, $3.4\times10^{16}$ $cm^{-3}$ and $1.5\times10^{17}$ $cm^{-3}$. This shows that it is possible to dope N to $Ga_2O_3$-based crystal and it is also possible to control the N concentration in the $Ga_2O_3$-based crystal by adjusting the N concentration in a source gas of ozone.

Next, electrical conduction properties of the Schottky barrier diode 1a were measured using a sample having the anode electrode 12 and the cathode electrode 13.

Figure 16A:
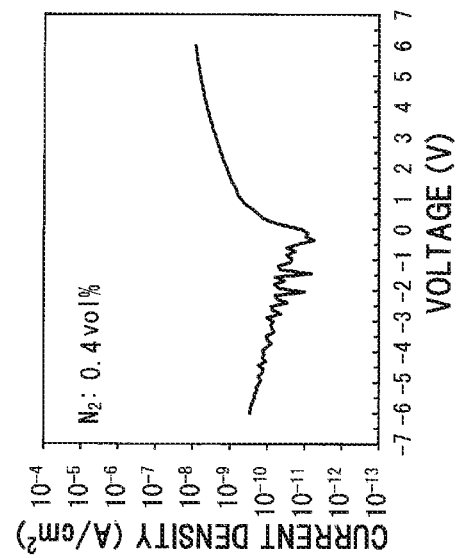
FIG. 16A is a graph showing electrical conduction properties of the Schottky barrier diode when the $N_2$ gas concentration in the $O_2$—$N_2$ gas mixture used for growth of the second $Ga_2O_3$-based crystal layer is 0 vol %.
Figure 16B:
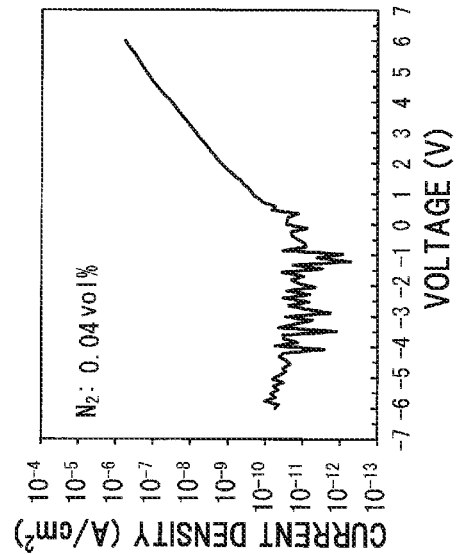
FIG. 16B is a graph showing electrical conduction properties of the Schottky barrier diode when the $N_2$ gas concentration in the $O_2$—$N_2$ gas mixture used for growth of the second $Ga_2O_3$-based crystal layer is 0.04 vol %.
Figure 16C:
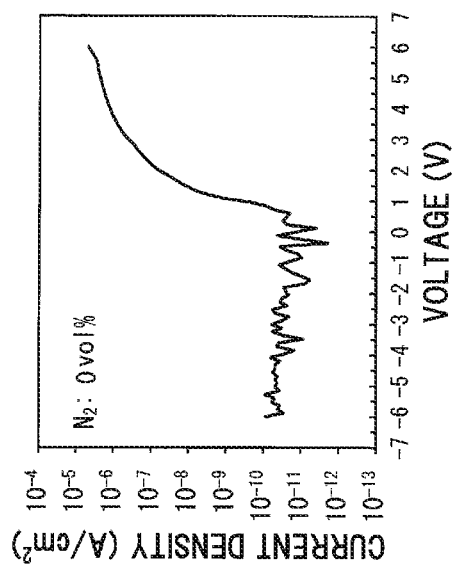
FIG. 16C is a graph showing electrical conduction properties of the Schottky barrier diode when the $N_2$ gas concentration in the $O_2$—$N_2$ gas mixture used for growth of the second $Ga_2O_3$-based crystal layer is 0.4 vol %.

FIGS. 16A, 16B and 16C are graphs showing electrical conduction properties of the Schottky barrier diode 1a when the $N_2$ gas concentration in the $O_2$—$N_2$ gas mixture used for growth of the second $Ga_2O_3$-based crystal layer 11 is respectively 0 vol %, 0.04 vol % and 0.4 vol %.

All of the Schottky barrier diodes 1a in FIGS. 16A, 16B and 16C exhibit n-type rectification properties in that a large amount of current flows only when the anode voltage is positive.

Figure 17:
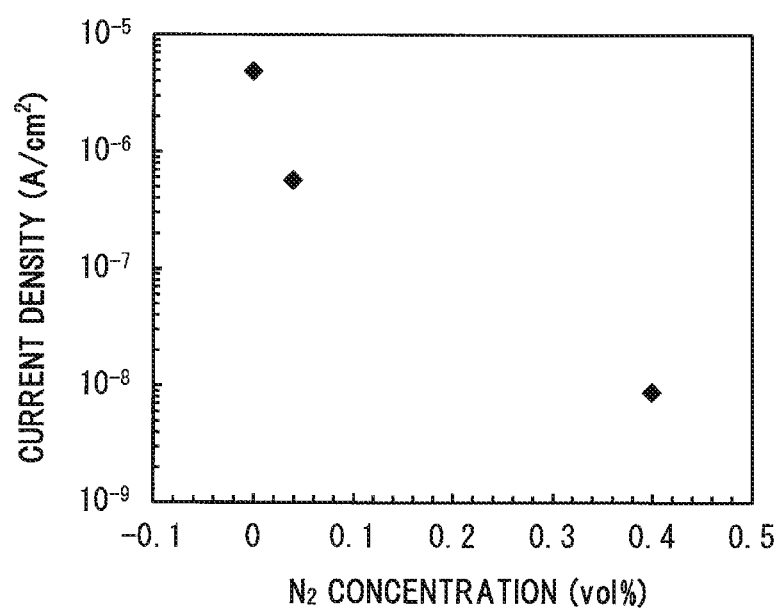
FIG. 17 is a graph showing a relation between the $N_2$ gas concentration in the $O_2$—$N_2$ gas mixture used for growth of the second $Ga_2O_3$-based crystal layer and forward current density when an anode voltage of the Schottky barrier diode is 6V.

FIG. 17 is a graph showing a relation between the $N_2$ gas concentration in the $O_2$—$N_2$ gas mixture used for growth of the second $Ga_2O_3$-based crystal layer 11 and forward current density when an anode voltage of the Schottky barrier diode 1a is 6V, which is derived from the current characteristics shown in FIGS. 16A, 16B and 16C.

The forward current density shown in FIG. 17, when the $N_2$ gas concentration in the $O_2$—$N_2$ gas mixture is 0 vol %, 0.04 vol % and 0.4 vol %, is respectively $4.88\times10^{-6}$, $5.70\times10^{-7}$ and $8.76\times10^{-9}$ $A/cm^2$.

FIG. 17 shows that the current exponentially decreases with an increase in the $N_2$ gas concentration. This shows that the intentionally doped N in the second $Ga_2O_3$-based crystal layer 11 contributes to increase resistance of the second $Ga_2O_3$-based crystal layer 11.

Although the embodiments and Examples of the invention have been described, the invention is not intended to be limited to the embodiments and Examples, and the various kinds of modifications can be implemented without departing from the gist of the invention. In addition, the constituent elements in the embodiment and Examples can be arbitrarily combined without departing from the gist of the invention.

In addition, the invention according to claims is not to be limited to the embodiments and Examples described above. Further, it should be noted that all combinations of the features described in the embodiments and Examples are not necessary to solve the problem of the invention.

INDUSTRIAL APPLICABILITY

Provided is a $Ga_2O_3$-based semiconductor device which has a $Ga_2O_3$-based crystal layer doped with a novel acceptor impurity.

REFERENCE SIGNS LIST 1a, 1b, 1c SCHOTTKY BARRIER DIODE
2a, 2b, 2c VERTICAL MOSFET
3a, 3b, 3c, 3d LATERAL MOSFET 3a
4a, 4b MESFET 4b
10, 20, 30, 40 FIRST $Ga_2O_3$-BASED CRYSTAL LAYER
11, 15, 21, 31, 36, 41, 45 SECOND $Ga_2O_3$-BASED CRYSTAL LAYER
101, 201, 204, 301, 303, 401 N-DOPED REGION

The invention claimed is:
1. A $Ga_2O_3$-based semiconductor device, comprising:
a first $Ga_2O_3$-based crystal layer;
a second $Ga_2O_3$-based crystal layer comprising a donor;
a gate electrode formed on the second $Ga_2O_3$-based crystal layer via a gate insulating film;
a source electrode formed on the second $Ga_2O_3$-based crystal layer;
a drain electrode formed on a surface of the first $Ga_2O_3$-based crystal layer opposite to the second $Ga_2O_3$-based crystal layer;
an N-doped region formed in a part of the second $Ga_2O_3$-based crystal layer, the N-doped region not being electrically connected to the source electrode,
wherein the N-doped region comprises N at a higher concentration than the donor and a top surface of the N-doped region is at a lower level than a top surface of the second $Ga_2O_3$-based crystal layer; and
an opening region in the N-doped region located below the gate electrode, the second $Ga_2O_3$-based crystal layer being located above and within the opening region in contact with the N-doped region,
wherein a current flows from the drain electrode to the source electrode through the opening region when the $Ga_2O_3$-based semiconductor device is in operation.

2. The $Ga_2O_3$-based semiconductor device according to claim 1, wherein an n+region is formed in the second $Ga_2O_3$-based crystal layer; and
a bottom surface of the n+region is at a higher level than the top surface of the N-doped region.

* * * * *